United States Patent
Akutsu et al.

(10) Patent No.: US 10,424,554 B2
(45) Date of Patent: Sep. 24, 2019

(54) ANISOTROPIC CONDUCTIVE FILM AND PRODUCTION METHOD OF THE SAME

(71) Applicant: DEXERIALS CORPORATION, Tokyo (JP)

(72) Inventors: Yasushi Akutsu, Utsunomiya (JP); Yuta Araki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 150 days.

(21) Appl. No.: 15/129,443

(22) PCT Filed: Mar. 20, 2015

(86) PCT No.: PCT/JP2015/058530
§ 371 (c)(1),
(2) Date: Sep. 27, 2016

(87) PCT Pub. No.: WO2015/151874
PCT Pub. Date: Oct. 8, 2015

(65) Prior Publication Data
US 2017/0103959 A1    Apr. 13, 2017

(30) Foreign Application Priority Data

Mar. 31, 2014   (JP) .................. 2014-072390

(51) Int. Cl.
   *C09J 7/00*      (2018.01)
   *H01J 23/00*     (2006.01)
   (Continued)

(52) U.S. Cl.
   CPC ............... *H01L 24/27* (2013.01); *H01B 1/22* (2013.01); *H01L 24/29* (2013.01); *H01L 24/32* (2013.01); *H01L 24/81* (2013.01); *H01L 24/83* (2013.01); *H01L 24/13* (2013.01); *H01L 24/16* (2013.01); *H01L 2224/13144* (2013.01); *H01L 2224/16227* (2013.01); *H01L 2224/271* (2013.01); *H01L 2224/27003* (2013.01); *H01L 2224/2743* (2013.01); *H01L 2224/27334* (2013.01);
   (Continued)

(58) Field of Classification Search
None
See application file for complete search history.

(56) References Cited

FOREIGN PATENT DOCUMENTS

JP    2006-233203 A    9/2006
JP    2010-033793 A    2/2010
(Continued)

OTHER PUBLICATIONS

Jun. 2, 2015 Written Opinion issued in International Patent Application No. PCT/JP2015/058530.
(Continued)

*Primary Examiner* — Jeffrey D Washville
(74) *Attorney, Agent, or Firm* — Oliff PLC

(57) ABSTRACT

An anisotropic conductive film that can be produced in high productivity and can reduce a short circuit occurrence ratio has a first conductive particle layer in which conductive particles are dispersed at a predetermined depth in a film thickness direction, and a second conductive particle layer in which conductive particles are dispersed at a depth different from that in the first conductive particle layer. In the respective conductive particle layers, the closest distances between the adjacent conductive particles are 2 times or more the average particle diameters of the conductive particles.

13 Claims, 9 Drawing Sheets

(A-A Cross Sectional View)

(51) Int. Cl.
 *B32B 27/20* (2006.01)
 *C09J 9/02* (2006.01)
 *B32B 27/08* (2006.01)
 *H01L 23/00* (2006.01)
 *H01B 1/22* (2006.01)

(52) U.S. Cl.
 CPC ............ *H01L 2224/27515* (2013.01); *H01L 2224/294* (2013.01); *H01L 2224/29005* (2013.01); *H01L 2224/2919* (2013.01); *H01L 2224/2929* (2013.01); *H01L 2224/2939* (2013.01); *H01L 2224/29082* (2013.01); *H01L 2224/29083* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/32057* (2013.01); *H01L 2224/32225* (2013.01); *H01L 2224/32501* (2013.01); *H01L 2224/73204* (2013.01); *H01L 2224/81488* (2013.01); *H01L 2224/81903* (2013.01); *H01L 2224/83101* (2013.01); *H01L 2224/83191* (2013.01); *H01L 2224/83192* (2013.01); *H01L 2224/83203* (2013.01); *H01L 2224/83488* (2013.01); *H01L 2224/83851* (2013.01); *H01L 2924/381* (2013.01)

(56) References Cited

FOREIGN PATENT DOCUMENTS

| | | |
|---|---|---|
| JP | 4661985 B2 | 3/2011 |
| JP | 4684087 B2 | 5/2011 |
| JP | 2011-171307 A | 9/2011 |
| JP | 4832059 B2 | 12/2011 |
| WO | 2013/024873 A1 | 2/2013 |
| WO | 2014/030753 A1 | 2/2014 |

OTHER PUBLICATIONS

Jun. 2, 2015 Search Report issued in International Patent Application No. PCT/JP2015/058530.
Jan. 22, 2019 Office Action issued in Chinese Application No. 201580018041.6.
Oct. 24, 2018 Office Action issued in Taiwanese Application No. 104109121.
Feb. 4, 2019 Office Action issued in Japanese Application No. 2015-057652.

(A-A Cross Sectional View)

(B-B Cross Sectional View)

ANISOTROPIC CONDUCTIVE FILM AND PRODUCTION METHOD OF THE SAME

TECHNICAL FIELD

The present invention relates to an anisotropic conductive film and a production method of the same.

BACKGROUND ART

An anisotropic conductive film has been widely used in mounting of electronic components such as an IC chip. In recent years, an anisotropic conductive film in which conductive particles are arranged in a single layer using a transfer mold has been proposed (Patent Literature 1) in order to improve the conductive particle capture efficiency and the connection reliability and decrease the short circuit occurrence ratio in terms of application to high mounting density.

In a production method of this anisotropic conductive film, the conductive particles are first held in many holes of a transfer mold having the holes, and an adhesion film having an adhesion layer for transfer is pressed onto the conductive particles to primarily transfer the conductive particles to the adhesion layer. Subsequently, a macromolecular film that is a component of the anisotropic conductive film is pressed onto the conductive particles attached to the adhesion layer, and heated and pressurized to secondarily transfer the conductive particles to a surface of the macromolecular film. A bonding layer is formed on a surface of the macromolecular film having the secondarily transferred conductive particles on a side of the conductive particles so as to cover the conductive particles. Thus, the anisotropic conductive film having the conductive particles at an arrangement pitch of about 9 µm is produced.

CITATION LIST

Patent Literature

Patent Literature 1: Japanese Patent Application Laid-Open No. 2010-33793

SUMMARY OF INVENTION

Technical Problem

However, when the arrangement pitch of the conductive particles is further decreased, it is difficult that the conductive particles are held according to the transfer mold and the held conductive particles are certainly transferred by the method for producing the anisotropic conductive film of Patent Literature 1. The productivity of the anisotropic conductive film is thus reduced. During a process of producing the anisotropic conductive film or use of the anisotropic conductive film in mounting of an electronic component, there are also problems in which three or more conductive particles may be connected, and as a result, short circuit is likely to occur.

An object of the present invention is to produce an anisotropic conductive film in high productivity even when the arrangement pitch of conductive particles in the anisotropic conductive film is decreased to deal with high-density mounting, and to reduce the short circuit occurrence ratio during use of the anisotropic conductive film in mounting of an electronic component.

Solution to Problem

The present inventor has found that when an anisotropic conductive film in which conductive particles are dispersed in an insulating resin layer is produced using a transfer mold, first and second insulating resin layers in which the conductive particles are dispersed using the transfer mold are adhered to each other, whereby the anisotropic conductive film having the conductive particles at a small arrangement pitch can be produced in high productivity, and also found that an unnecessary connection of the conductive particles can be controlled. The present invention has thus been completed.

Specifically, the present invention provides an anisotropic conductive film in which conductive particles are dispersed in an insulating resin layer, the anisotropic conductive film including: a first conductive particle layer in which conductive particles are dispersed at a predetermined depth in a film thickness of the anisotropic conductive film; and a second conductive particle layer in which conductive particles are dispersed at a depth that is different from that of the first conductive particle layer, wherein in each of the conductive particle layers, a closest distance between the adjacent conductive particles is 2 times or more an average particle diameter of the conductive particles.

The present invention further provides a method being capable of producing the above-described anisotropic conductive film, the method including:

a step A of placing each of the conductive particles into each of a plurality of recess portions of a first transfer mold having the recess portions formed therein;

a step B of forming a first insulating resin layer to which the conductive particles in the first transfer mold are transferred and bonded to the insulating resin layer;

a step C of placing each of conductive particles into each of a plurality of recess portions of a second transfer mold having the recess portions formed therein;

a step D of forming a second insulating resin layer to which the conductive particles in the second transfer mold are transferred and bonded to the insulating resin layer; and a step E of facing a surface of the first insulating resin layer to which the conductive particles are transferred and bonded and a surface of the second insulating resin layer to which the conductive particles are transferred and bonded, and layering and integrating the first and second insulating resin layers, wherein in each of the transfer molds, a closest distance between the adjacent recess portions is 2 times or more an average particle diameter of the conductive particles to be placed in the transfer molds.

Advantageous Effects of Invention

The anisotropic conductive film of the present invention can be produced by adhering first and second insulating resin layers in which conductive particles are dispersed using transfer molds. Therefore, a pitch between the conductive particles by the transfer mold before adhesion can be made larger than a pitch between the conductive particles in the anisotropic conductive film, and the productivity of the anisotropic conductive film can be increased.

During production of the anisotropic conductive film or use of the anisotropic conductive film in mounting of an electronic component, even when first conductive particles contained in the first conductive particle layer and second conductive particles contained in the second conductive particle layer are connected in a film surface direction, other than the first conductive particles and the second conductive particles connected, third conductive particles are hardly connected. This is because the closest distance between the adjacent conductive particles in each of the first conductive particle layer and the second conductive particle layer is 2 times or more the average particle diameter of the conductive particles. Accordingly, the short circuit occurrence ratio can be decreased.

DESCRIPTION OF EMBODIMENTS

Figure 1A:
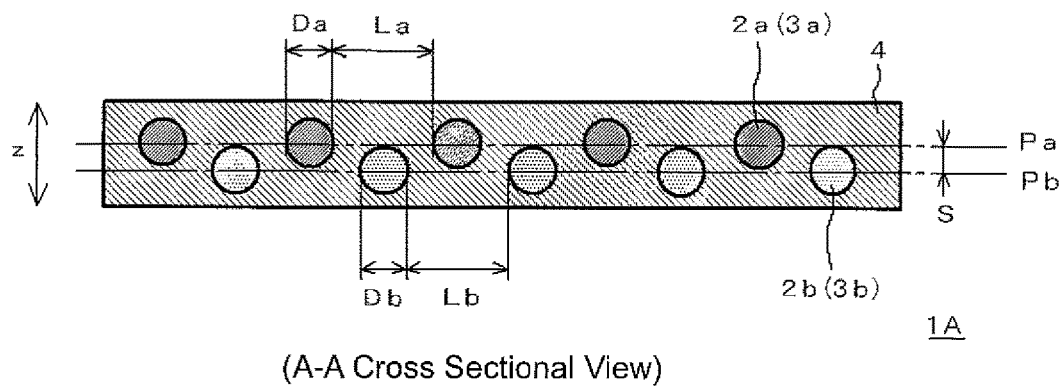
FIG. 1A is a cross-sectional view of an anisotropic conductive film 1A of an embodiment.

Hereinafter, an example of the anisotropic conductive film of the present invention will be described in detail with reference to the drawings. In the drawings, the same reference numerals denote the same or similar components.

<<Entire Configuration of Anisotropic Conductive Film>>

Figure 1B:
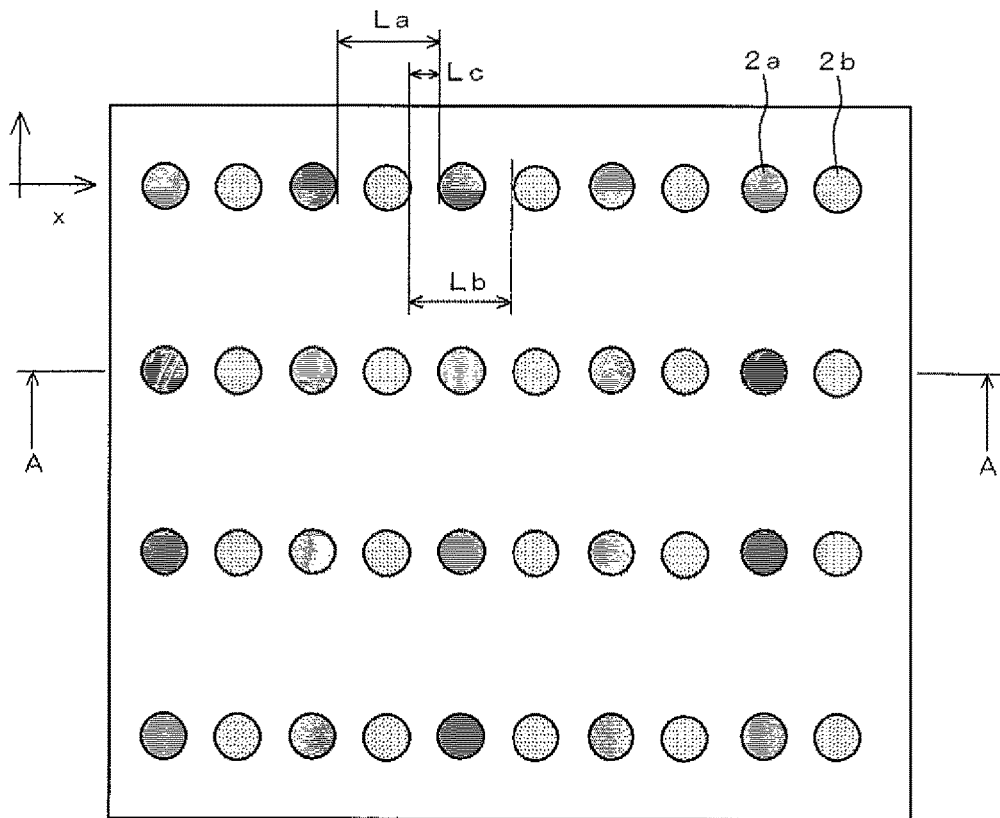
FIG. 1B is a plan view illustrating the arrangement of conductive particles in the anisotropic conductive film 1A of the embodiment.

FIG. 1A is a cross-sectional view of an anisotropic conductive film 1A of an embodiment of the present invention. FIG. 1B is a plan view illustrating the arrangement of conductive particles in the anisotropic conductive film 1A. This anisotropic conductive film 1A is an insulating resin layer 4 in which conductive particles 2a and 2b are dispersed, and has a first conductive particle layer 3a in which the conductive particles 2a (in the drawing, shown by a deep color) are dispersed at a predetermined depth in a film thickness direction z of the anisotropic conductive film 1A and a second conductive particle layer 3b in which the conductive particles 2b (in the drawing, shown by a light color) are dispersed at a depth that is different from that of the first conductive particle layer 3a.

As shown in FIG. 1B, the conductive particles 2a and 2b are squarely arrayed in the conductive particle layers 3a and 3b, respectively. The array of the conductive particles 2b in the second conductive particle layer 3b is shifted by a half of pitch of array lattice in an array direction x of the first conductive particle layer 3a with respect to the array of the conductive particles 2a in the first conductive particle layer 3a.

Herein, the matter in which the depth in the film thickness direction z of the second conductive particle layer 3b at which the conductive particles 2b are dispersed and the depth in the film thickness direction z of the first conductive particle layer 3a at which the conductive particles 2a are dispersed are different from each other means that a distance S between a center line Pa of the conductive particles 2a parallel to a film surface and a center line Pb of the conductive particles 2b parallel to the film surface is 1/5 times or more the average particle diameter of the conductive particles 2a and 2b. This distance S is preferably 1/2 times or more, and more preferably 1/2 to 5 times the average particle diameter of the conductive particles 2a and 2b. Herein, the average particle diameter of the conductive particles 2a and 2b is the average particle diameter of the whole conductive particles 2a and 2b.

Figure 2A:
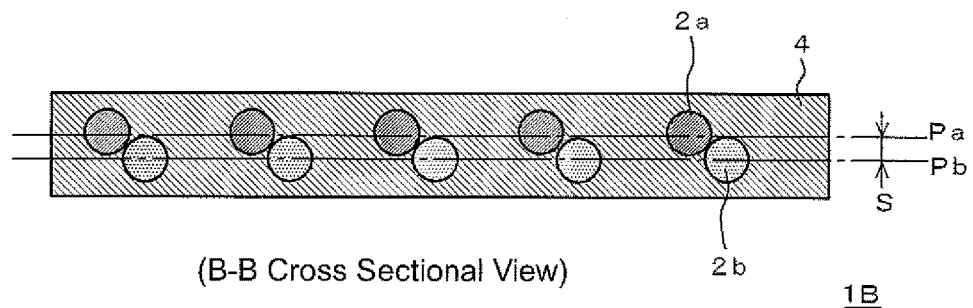
FIG. 2A is a cross-sectional view of an anisotropic conductive film 1B of an embodiment in which conductive particles in a first conductive particle layer and conductive particles in a second conductive particle layer are connected.
Figure 2B:
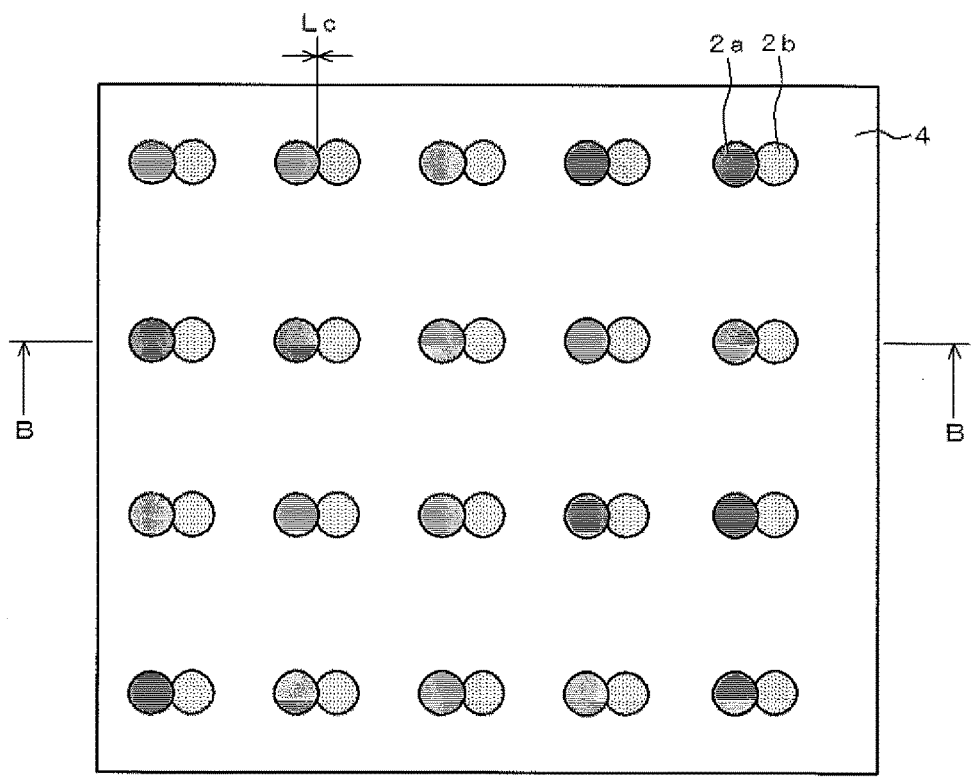
FIG. 2B is a plan view of the anisotropic conductive film of the embodiment in which the conductive particles in the first conductive particle layer and the conductive particles in the second conductive particle layer are connected.

In the anisotropic conductive film 1A, the closest distance La between the adjacent conductive particles in the first conductive particle layer 3a is 2 times or more, and preferably 2 times or more and 50 times or less the average particle diameter Da of the conductive particles 2a in the first conductive particle layer 3a. The closest distance Lb between the adjacent conductive particles in the second conductive particle layer 3b is also 2 times or more, and preferably 2 times or more and 50 times or less the average particle diameter Db of the conductive particles 2b in the second conductive particle layer 3b. As described above, when the closest distances La and Lb between the adjacent conductive particles in the respective conductive particle layers 3a and 3b are set to be 2 times or more the average particle diameters Da and Db of the conductive particles 2a and 2b, respectively, the connection of three or more conductive particles that would be appeared like a case using a transfer mold with a small pitch does not occur even if the arrangements of the first conductive particle layer 3a and the second conductive particle layer 3b are shifted to each other in a process of producing the anisotropic conductive film and, like an anisotropic conductive film 1B shown in FIGS. 2A and 2B, each one of the conductive particles 2a in the first conductive particle layer 3a and each one of the conductive particles 2b in the second conductive particle layer 3b are connected so that a distance Lc between the closest conductive particles in a plan view of the anisotropic conductive film is zero. For this reason, the occurrence of short circuit can be suppressed during use of the anisotropic conductive film 1B in anisotropic conductive connection of an electronic component.

Figure 3A:
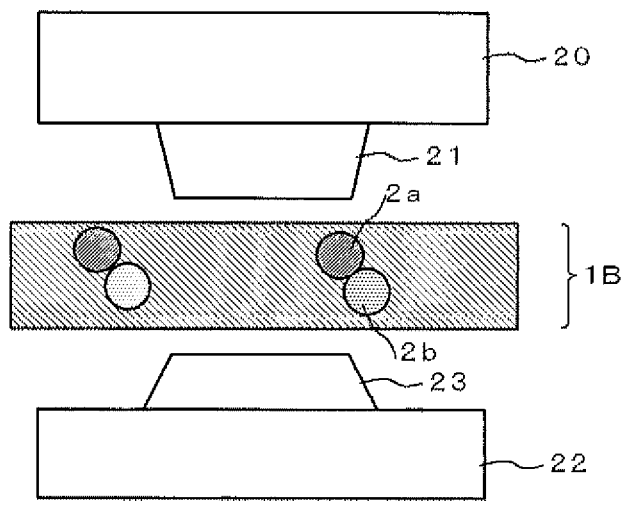
FIG. 3A is a view illustrating conductive particle capture properties of the anisotropic conductive film 1B of the embodiment during anisotropic conductive connection.
Figure 3B:
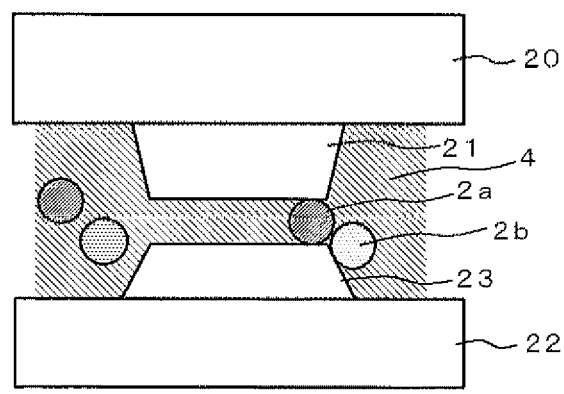
FIG. 3B is a view illustrating conductive particle capture properties of the anisotropic conductive film 1B of the embodiment during anisotropic conductive connection.

When the anisotropic conductive film 1B in which each one of the conductive particles 2a in the first conductive particle layer 3a and each one of the conductive particles 2b in the second conductive particle layer 3b are connected is used in anisotropic conductive connection, the two connected conductive particles 2a and 2b may be disposed between an edge of a terminal 21 of an electronic component 20 and an edge of a terminal 23 of an electronic component 22, as shown in FIG. 3A. However, as shown in FIG. 3B, two connected conductive particles positioned at the edges of the terminals 21 and 23 are more easily captured by the terminals 21 and 23 than one conductive particle after heating and pressurization in anisotropic conductive connection. Thus, according to the anisotropic conductive film of the present invention, the conductive particle capture properties in anisotropic conductive connection can also be improved.

Figure 6:
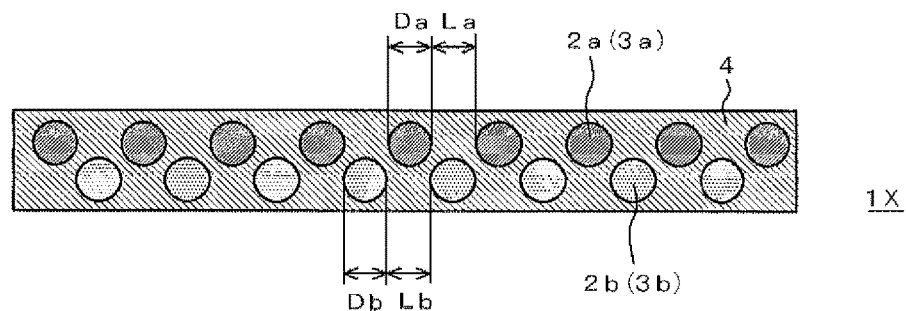
FIG. 6 is a cross-sectional view of an anisotropic conductive film 1X in which the arrangement pitch of conductive particles is small.

On the other hand, even in an anisotropic conductive film having two conductive particle layers 3a and 3b like an anisotropic conductive film 1X shown in FIG. 6, when the arrangement pitch of the conductive particles 2a and 2b in each conductive particle layer is small and the closest distances La and Lb between the adjacent conductive particles 2a and 2b in the conductive particle layers 3a and 3b are less than 2 times the average particle diameters Da and Db of the conductive particles 2a and 2b, respectively, short circuit is easy to occur during anisotropic conductive connection using the anisotropic conductive film. Therefore, this is not preferred.

Figure 4:
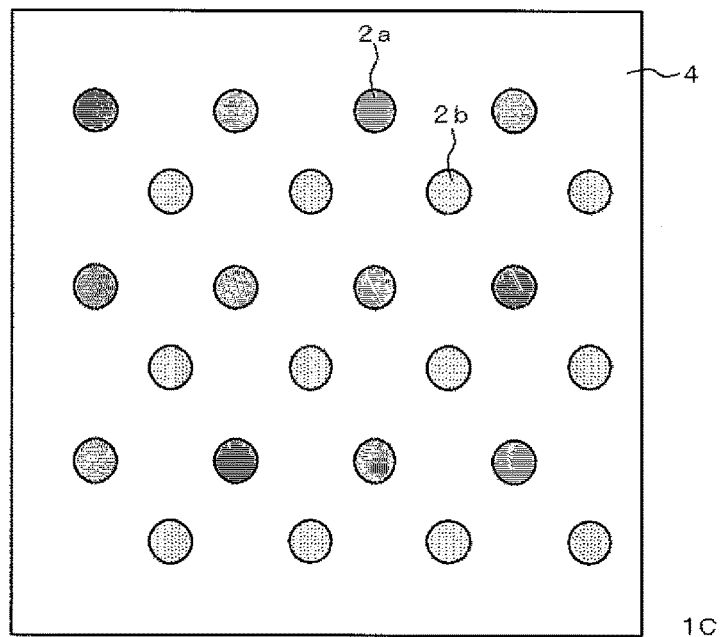
FIG. 4 is a plan view illustrating the arrangement of conductive particles in an anisotropic conductive film 1C of an embodiment.

In the anisotropic conductive film of the present invention, the conductive particles 2a and 2b can be disposed at various arrangements as long as the closest distance between the conductive particles in each of the conductive particle layers 3a and 3b is 2 times or more the average particle diameter of the conductive particles. For example, like an anisotropic conductive film 1C shown in FIG. 4, the array of the conductive particles 2a in the first conductive particle layer 3a and the array of the conductive particles 2b in the second conductive particle layer 3b are each a square array. The array of the conductive particles 2b in the second conductive particle layer 3b can be shifted by a half of pitch of array lattice in an oblique direction with respect to the array of the conductive particles 2a of the first conductive particle layer 3a. The array of the conductive particles in each of the conductive particle layers is not limited to a square array, and may be a triangular array or a random array. The random array may be produced, for example, by disposing the conductive particles on a film capable of being stretched, and stretching the film so that the conductive particles are separated by a predetermined distance.

Figure 5:
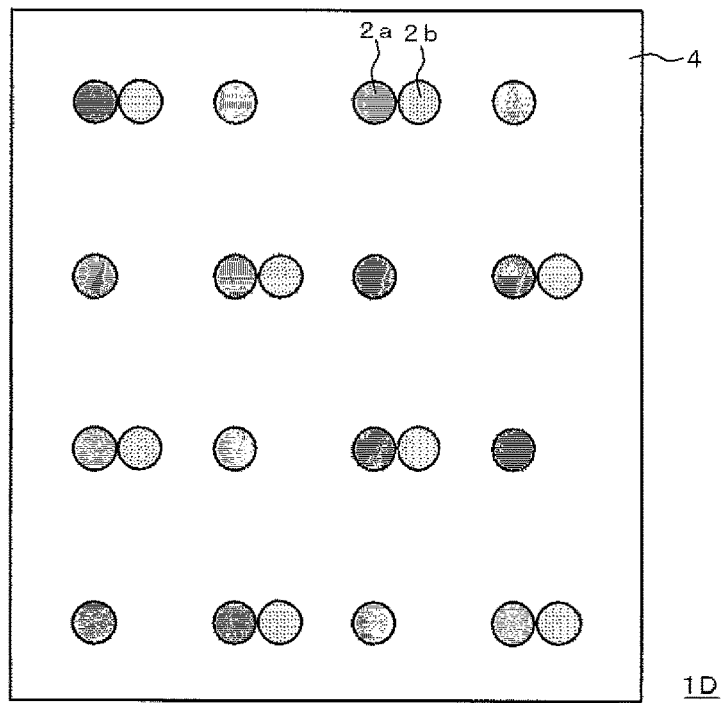
FIG. 5 is a plan view illustrating the arrangement of conductive particles in an anisotropic conductive film 1D of an embodiment.

The array pattern and the pitch in the first conductive particle layer 3a and those in the second conductive particle layer 3b may be the same or different. When the array patterns and the pitches are the same, there is an advantage in terms of production in which the quality of dispersion state of the conductive particles after adhesion can be easily judged. For example, in an anisotropic conductive film 1D shown in FIG. 5, the conductive particles 2a in the first conductive particle layer 3a are arranged in a square array and the conductive particles 2b in the second conductive particle layer 3b are arranged in an oblique array. The conductive particles 2b in the second conductive particle layer 3b are thus always arranged horizontally next to the conductive particles 2a in the first conductive particle layer 3a. In this case, when there is a part where the conductive particles 2b in the second conductive particle layer 3b are not arranged horizontally next to the conductive particles 2a in the first conductive particle layer 3a, the part facilitates noticing of having no intended array of the conductive particles.

<<Conductive Particles>>

As the conductive particles 2a and 2b, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

In order to facilitate elimination of variation of wiring height to prevent an increase in resistance and prevent short circuit from being caused, the average particle diameter of the conductive particles is preferably 1 to 10 μm, and more preferably 2 to 6 μm. The average particle diameter of the conductive particles 2a in the first conductive particle layer 3a and the average particle diameter of the conductive particles 2b in the second conductive particle layer 3b may be the same or different.

When the conductive particles are metal-coated resin particles, the particle hardness (20% K value; compression elastic deformation property $K_{20}$) of resin core particles is preferably 100 to 1,000 $kgf/mm^2$, and more preferably 200 to 500 $kgf/mm^2$ in order to achieve favorable connection reliability. The particle hardness of the conductive particles 2a in the first conductive particle layer 3a and the particle hardness of the conductive particles 2b in the second conductive particle layer 3b may be the same or different.

As such a resin core, a particle formed of a plastic material having excellent compression deformation is preferably used. For example, the resin core may be formed of a (meth)acrylate-based resin, a polystyrene-based resin, a styrene-(meth)acrylic acid copolymer resin, a urethane-based resin, an epoxy-based resin, a phenol resin, an acrylonitrile-styrene (AS) resin, a benzoguanamine resin, a divinylbenzene-based resin, a polyester resin, or the like. Herein "(meth)acrylate" includes acrylate and methacrylate.

The resin core may be formed of any one of the (meth)acrylate-based resin and the polystyrene-based resin or a blend composition of the resins. The resin core may be formed of a copolymer of a (meth)acrylate-based monomer with a styrene-based monomer described below.

It is preferable that the (meth)acrylate-based resin be a copolymer of the (meth)acrylate-based monomer, and if necessary, a compound having a reactive double bond copolymerizable with the (meth)acrylate-based monomer (e.g., a vinyl-based monomer and unsaturated carboxylic acid monomer) and a bifunctional or multifunctional monomer. Herein, the monomer also includes an oligomer that is a polymer of two or more monomers as long as it is capable of being polymerized by heating, irradiation with ultraviolet light, or the like.

Examples of the (meth)acrylate-based monomer may include methyl (meth)acrylate, ethyl (meth)acrylate, propyl (meth) acrylate, butyl(meth)acrylate, 2-ethylhexyl (meth) acrylate, lauryl (meth)acrylate, stearyl (meth)acrylate, cyclohexyl (meth)acrylate, 2-hydroxyethyl (meth)acrylate, 2-propyl (meth)acrylate, chloro-2-hydroxyethyl (meth) acrylate, diethylene glycol mono(meth)acrylate, methoxyethyl (meth) acrylate, glycidyl (meth) acrylate, dicyclopentanyl (meth) acrylate, dicyclopentenyl (meth)acrylate, and isobornyl (meth)acrylate.

Further, it is preferable that the polystyrene-based resin be a copolymer of the styrene-based monomer, and if necessary, a compound having a reactive double bond copolymerizable with the styrene-based monomer (e.g., a vinyl-based monomer and unsaturated carboxylic acid monomer) and a bifunctional or multifunctional monomer. Herein, the monomer also includes an oligomer that is a polymer of two or more monomers as long as it is capable of being polymerized by heating, irradiation with ultraviolet light, or the like.

Examples of the styrene-based monomer may include alkyl styrenes such as styrene, methylstyrene, dimethylstyrene, trimethylstyrene, ethylstyrene, diethylstyrene, triethylstyrene, propylstyrene, butylstyrene, hexylstyrene, heptylstyrene, and octylstyrene; halogenated styrenes such as florostyrene, chlorostyrene, bromostyrene, dibromostyrene, iodestyrene, and chloromethylstyrene; and nitrostyrene, acetylstyrene, and methoxystyrene.

An example of preferable (meth)acrylate-based resin constituting the resin core may be a (meth)acrylate-based resin configured by a polymer of a urethane compound with the (meth)acrylate-based monomer. As the urethane compound, multifunctional urethane acrylate may be used, for example, bifunctional urethane acrylate or the like may be used. Herein, it is preferable that the content of the urethane compound be 5 parts by weight or more, and more preferably 25 parts by weight or more, relative to 100 parts by weight of the monomer.

When distances between counter electrodes of two electronic components to be connected by anisotropic conductive connection are substantially constant (for example, the heights of bumps of an IC chip are uniform), it is preferable that the size, hardness, and material properties of the conductive particles $2a$ and $2b$ be the same in practical terms. In this case, the conductive particles existing between the counter electrodes to be connected during anisotropic conductive connection can be uniformly crushed. Therefore, the initial conduction resistance can be decreased, the conduction reliability can be improved, and the short circuit occurrence ratio can be decreased.

In contrast, when the distances between counter electrodes of the two electronic components to be connected by anisotropic conductive connection have variations (for example, the heights of bumps of an IC chip have variations), the use of conductive particles having the same size, hardness, and material properties as the conductive particles $2a$ and $2b$ may cause inconvenience. For example, when only relatively small conductive particles are used, the conductive particles are not sufficiently crushed between the counter electrodes over the relatively wide distance between the electrodes. Therefore, indentations are ununifom during anisotropic conductive connection. During inspection of a product, the product may be judged to be poor, the initial conduction resistance may be increased, and the conduction reliability may be reduced. Further, when only conductive particles having relatively high hardness are used, indentations are strongly expressed between the counter electrodes over the relatively narrow distance between the electrodes while the conductive particles themselves are not sufficiently crushed. Therefore, the initial conduction resistance may be increased, and the conduction reliability may be reduced. Accordingly, when there are variations of the distance between the counter electrodes of the two electronic components to be connected by anisotropic conductive connection, it is preferable that conductive particles having different sizes and hardnesses be used as the conductive particles $2a$ and $2b$ in order to cancel the variations. In this case, it is preferable that the array pattern of the conductive particles be such a pattern that the variations of the distance between the counter electrodes of the two electronic components to be connected by anisotropic conductive connection can be canceled.

When, in the insulating resin layer 4, is too small, the total amount of the conductive particles $2a$ in the first conductive particle layer $3a$ and the conductive particles $2b$ in the second conductive particle layer $3b$ the conductive particle capture number decreases, and the anisotropic conductive connection is thus made difficult. When the total amount is too large, short circuit may occur. Therefore, the total amount is preferably 50 to 50,000, and more preferably 200 to 50,000 per square millimeter.

<<Insulating Resin Layer>>

As the insulating resin layer 4, an insulating resin layer used for a publicly known anisotropic conductive film can be appropriately used For example, a resin layer formed of a photopolymerizable resin containing a (meth)acrylate compound and a photo-radical polymerization initiator, a resin layer formed of a thermally polymerizable resin containing a (meth)acrylate compound and a thermal radical polymerization initiator, a resin layer formed of a thermally polymerizable resin containing an epoxy compound and a thermal cationic polymerization initiator, a resin layer formed of a thermally polymerizable resin containing an epoxy compound and a thermal anionic polymerization initiator, or the like, can be used. When the photo-radical polymerization initiator is used, a thermal radical polymerization initiator may be used in addition to the photo-radical polymerization initiator. Further, the insulating resin layer 4 may be formed of a plurality of resin layers.

As the (meth)acrylate compound, a conventionally known photopolymerizable (meth)acrylate monomer may be used. For example, a monofunctional (meth)acrylate-based monomer, or a multifunctional (meth)acrylate-based monomer such as a bifunctional or more (meth)acrylate-based monomer may be used. In the present invention, in order to thermally cure the insulating resin layer during anisotropic conductive connection, it is preferable that the multifunctional (meth)acrylate-based monomer be used for at least a portion of the (meth)acrylate-based monomer.

Examples of the photo-radical polymerization initiator may include publicly known photo-radical polymerization initiators such as an acetophenone-based photopolymerization initiator, a benzylketal-based photopolymerization initiator, and a phosphorus-based photopolymerization initiator.

When the amount of the photo-radical polymerization initiator to be used is too small relative to 100 parts by mass of the acrylate compound, polymerization does not sufficiently proceed. When the amount is too large, stiffness may decrease. Therefore, the amount is preferably 0.1 to 25 parts by mass, and more preferably 0.5 to 15 parts by mass.

Examples of the thermal radical polymerization initiator may include an organic peroxide and an azo-based compound. In particular, an organic peroxide that does not generate nitrogen causing bubbles can be preferably used.

When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

As the thermal cationic polymerization initiator, a publicly known thermal cationic polymerization initiator for an epoxy compound can be used. For example, a iodonium salt, sulfonium salt, phosphonium salt, or ferrocenes that generates an acid by heat can be used. An aromatic sulfonium salt that exhibits favorable latency for temperature can be particularly preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

As the thermal anionic polymerization initiator, a publicly known thermal anionic polymerization initiator for an epoxy compound can be used. For example, an aliphatic amine-based compound, aromatic amine-based compound, secondary or tertiary amine-based compound, imidazole-based compound, polymercaptan-based compound, boron trifluoride-amine complex, dicyandiamide, or organic acid hydrazide that generates a base by heat can be used. An encapsulated imidazole-based compound that exhibits favorable latency for temperature can be particularly preferably used.

When the amount of the thermal anionic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

In an aspect in which the insulating resin layer 4 is formed of a plurality of resin layers, an insulating resin layer holding the first conductive particle layer 3a and an insulating resin layer holding the second conductive particle layer 3b can be formed of separate resin layers. Further, an intermediate resin layer may be provided between the insulating resin layer holding the first conductive particle layer 3a and the insulating resin layer holding the second conductive particle layer 3b to bond the insulating resin layers. Moreover, to this intermediate resin layer, a function of relaxing a stress applied to the conductive particles during winding, unwinding, and transporting the anisotropic conductive film, and unrolling of the film at an anisotropic conductive connection process may be imparted. On a surface of this insulating resin layer 4, a relatively thick insulating binder layer containing no conductive particles may be provided (not shown in the drawings).

When the stress relaxation function is imparted to the intermediate resin layer, the intermediate resin layer can be formed of a resin containing no polymerization initiator. Examples of the resin forming the intermediate resin layer in this case may include a phenoxy resin, an epoxy resin, a polyolefin resin, a polyurethane resin, and an acrylic resin.

<<Production Method of Anisotropic Conductive Film>>

(i) Outline

The anisotropic conductive film 1A shown in FIGS. 1A and 1B can be produced approximately as follows.

Figure 7A:
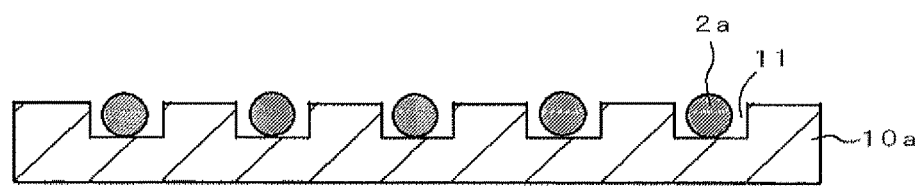
FIG. 7A is a view illustrating a process in a production method of an anisotropic conductive film.

As shown in FIG. 7A, the conductive particles 2a are placed into a plurality of recess portions 11 of a first transfer mold 10a having the recess portions 11 on a planar surface (step A). Subsequently, a first insulating resin layer 4a to which the conductive particles 2a in the first transfer mold 10a are transferred and bonded to the insulating resin layer is formed (step B) (FIGS. 7B to 7E).

Similarly, the conductive particles are placed into a plurality of recess portions of a second transfer mold having the recess portions (step C), and a second insulating resin layer to which the conductive particles in the second transfer mold are transferred and bonded to the insulating resin layer is formed (step D).

In this case, the closest distance between the adjacent recess portions in the first transfer mold and the second transfer mold is 2 times or more the average particle diameter of the conductive particles to be placed in the transfer molds.

Figure 7B:
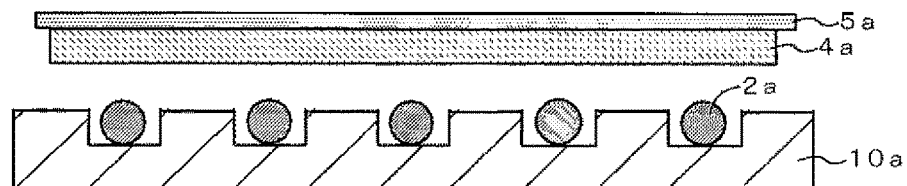
FIG. 7B is a view illustrating a process in the production method of an anisotropic conductive film.
Figure 7C:
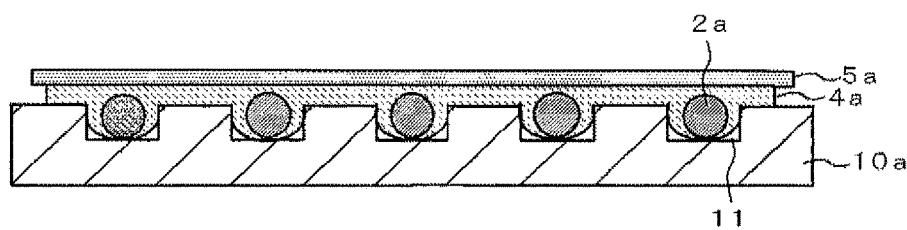
FIG. 7C is a view illustrating a process in the production method of an anisotropic conductive film.
Figure 7D:
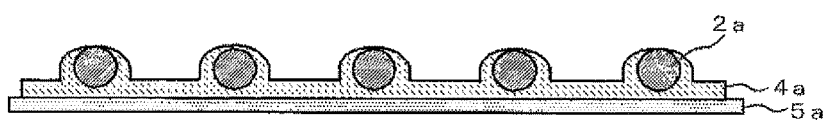
FIG. 7D is a view illustrating a process in the production method of an anisotropic conductive film.
Figure 7E:
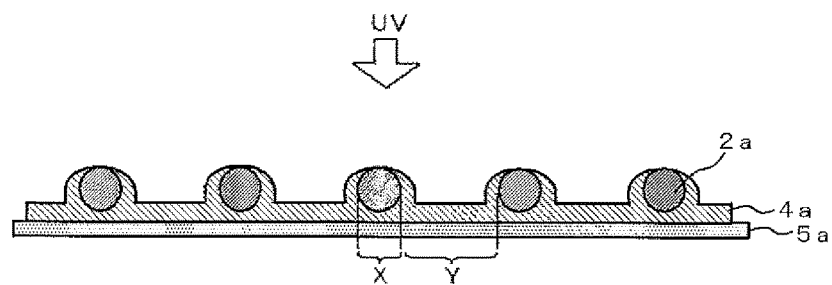
FIG. 7E is a view illustrating a process in the production method of an anisotropic conductive film.
Figure 7F:
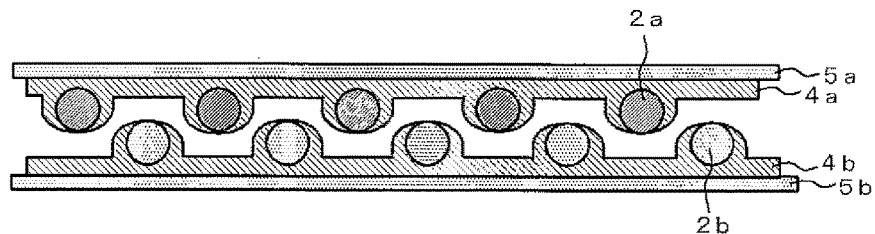
FIG. 7F is a view illustrating a process in the production method of an anisotropic conductive film.
Figure 7G:
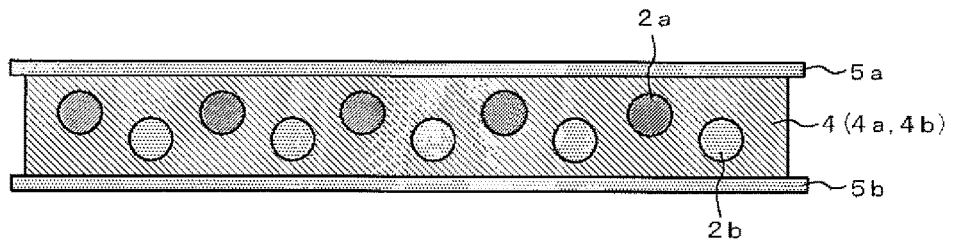
FIG. 7G is a view illustrating a process in the production method of an anisotropic conductive film.

A surface of the first insulating resin layer 4a to which the conductive particles 2a are transferred and bonded and a surface of the second insulating resin layer 4b to which the conductive particles 2b are transferred and bonded are faced to each other, and layered and integrated (step E) (FIGS. 7F to 7G).

When the anisotropic conductive film is thus produced by adhering the insulating resin layers to which the conductive particles are transferred and bonded, the production efficiency of the anisotropic conductive film can be increased. Therefore, in each of the insulating resin layers to be adhered, the density of dispersion of the conductive particles can be decreased. Accordingly, the amount of the filled conductive particles in each of the transfer molds can be decreased, and the yield at a filling step can be improved. In a conventional production method of an anisotropic conductive film in which insulating resin layers to which conductive particles are transferred and bonded are not adhered, the number of the filled conductive particles in a transfer mold is small. Therefore, an anisotropic conductive film obtained by the conventional method cannot be used in wiring of fine pitch. However, according to the production method of the present invention, the anisotropic conductive film that has the conductive particles dispersed at high density and can be used in terminals of fine pitch can be produced using the transfer molds.

(ii) Transfer Mold

As the first transfer mold and the second transfer mold, for example, an inorganic material such as silicon, various ceramics, glass, and metal including stainless steel, or an organic material such as various resins in which an opening is formed by a publicly known opening-forming method such as a photolithography method can be used. The transfer molds may have a shape of a plate, a roll, or the like.

Examples of shape of the recess portions of the first transfer mold and the second transfer mold may include a pillar shape such as a columnar shape and a quadrangular prism shape, and a pyramidal shape such as a truncated cone shape, a truncated pyramidal shape, a conical shape, and a quadrangular pyramidal shape.

The array of the recess portions may be a lattice pattern, a zigzag pattern, or the like, depending on the array of the conductive particles.

The ratio of the average particle diameter of the conductive particles to the depth of the recess portions (=the average particle diameter of the conductive particles/the depth of the openings) is preferably 0.4 to 3.0, and more preferably 0.5 to 1.5 in terms of balance between improvement of transferring properties and conductive particle retention ability. The diameter and the depth of the recess portions of the transfer molds can be measured by a laser microscope.

The ratio of the opening diameter of the recess portions to the average particle diameter of the conductive particles (=the opening diameter of the recess portions/the average particle diameter of the conductive particles) is preferably 1.1 to 2.0, and more preferably 1.3 to 1.8 in terms of balance between easy accommodation of the conductive particles, easy pushing of an insulating resin, and the like.

When the base diameter of the recess portions is smaller than the opening diameter of the recess portions, it is preferable that the base diameter be 1.1 times or more and less than 2 times the diameter of the conductive particles and the opening diameter be 1.3 times or more and less than 3 times the diameter of the conductive particles.

(iii) Steps A and C

A procedure of accommodating the conductive particles 2a and 2b in the recess portions of the first transfer mold and the second transfer mold is not particularly limited, and a publicly known procedure can be utilized. For example, dried conductive particles or a dispersion liquid in which the conductive particles are dispersed in a solvent is sprayed on or applied to a surface having the recess portions of the transfer molds formed therein, and the surface having the recess portions 11 may be wiped using a brush, a blade, or the like.

(iv) Steps B and D

The step B of forming the first insulating resin layer 4a to which the conductive particles 2a are transferred and bonded, the step D of forming the second insulating resin layer 4b to which the conductive particles 2b are transferred and bonded, and the step E of layering and integrating the layers may take various aspects depending on the kind of the insulating resin constituting the first insulating resin layer 4a and the second insulating resin layer 4b.

(iv-1) When Insulating Resin layer is formed of Adhesion Resin

For example, when in the steps B and D, the first insulating resin layer 4a and the second insulating resin layer 4b are each formed of an adhesion resin having adhesion to the conductive particles, an adhesion resin layer is pressed onto the conductive particles 2a and 2b accommodated in the transfer molds, and the adhesion resin layer is only released from the transfer molds. Thus, the first insulating resin layer 4a and the second insulating resin layer 4b to which the conductive particles 2a and 2b are transferred and bonded can be obtained.

(iv-2) When Insulating Resin Layer is formed of Thermally Polymerizable Resin

When in the steps B and D, the first insulating resin layer 4a and the second insulating resin layer 4b are each formed of a thermally polymerizable resin, by a first method in the step B, a thermally polymerizable resin layer is pressed onto the conductive particles 2a accommodated in the first transfer mold 10a to attach the conductive particles 2a to the thermally polymerizable resin layer, the thermally polymerizable resin layer having the attached conductive particles 2a is released from the transfer mold, and the thermally polymerizable resin layer is then polymerized by heating to form a thermally polymerized resin layer. Thus, the conductive particles 2a are fixed in the thermally polymerized resin layer. Alternatively, by a second method, a thermally polymerizable resin layer is pressed onto the conductive particles 2a accommodated in the first transfer mold 10a, a thermally polymerizable resin is polymerized by heating with the conductive particles 2a accommodated in the first transfer mold 10a, and released from the first transfer mold 10a. Thus, the first insulating resin layer 4a to which the conductive particles 2a are transferred and bonded is obtained.

Similarly, the thermally polymerizable resin is used in the step D, and the second insulating resin layer 4b to which the conductive particles 2b are transferred and bonded by the first method or the second method is obtained.

As described below, when in the step E, the first insulating resin layer and the second insulating resin layer in a semi-cured state are layered and cured by heating to be integrated, polymerization by heating in the steps B and D may be performed so that the thermally polymerizable resin layer is in a semi-cured state. In contrast, when in the step E, the first insulating resin layer and the second insulating resin layer are layered through a separate intermediate resin layer and integrated, the thermally polymerizable resin layer may be completely cured in the polymerization by heating in the steps B and D.

(iv-3) When Insulating Resin Layer is formed of Photopolymerizable Resin

When the first insulating resin layer 4a is formed using a photopolymerizable resin, the first insulating resin layer to which the conductive particles accommodated in the transfer mold are transferred and bonded can be easily produced. Therefore, this is preferred. Examples of a method for forming the first insulating resin layer 4a using the photopolymerizable resin may include a first method performed by (a1) pressing the photopolymerizable resin layer onto the conductive particles 2a in the first transfer mold 10a to attach the conductive particles to the photopolymerizable resin layer, (a2) releasing the photopolymerizable resin layer from the transfer mold to obtain the photopolymerizable resin layer to which the conductive particles are transferred and bonded, and (a3) irradiating the photopolymerizable resin layer, to which the conductive particles are transferred and bonded, with ultraviolet light to convert the photopolymerizable resin to a photopolymerized resin.

More specifically, as shown in FIG. 7B, the first insulating resin layer 4a formed of the photopolymerizable resin on a release film 5a is faced to the conductive particles 2a accommodated in the first transfer mold 10a. As shown in FIG. 7C, a pressure is applied to the first insulating resin layer 4a to push the insulating resin into the recess portions 11, and thus, the conductive particles 2a are embedded in the first insulating resin layer 4a. As shown in FIG. 7D, the first insulating resin layer 4a to which the conductive particles 2a are transferred and bonded is released from the first transfer mold 10a, and irradiated with UV. In this case, it is preferable that the first insulating resin layer 4a be irradiated with ultraviolet light UV from a side of the conductive particles 2a, as shown in FIG. 7E. Thus, the conductive particles 2a can be fixed in the first insulating resin layer 4a. In addition, the curing ratio of a region X that is below the conductive particles 2a and is shadowed during irradiation with UV can be made lower than a region Y around the region X. Therefore, the pushing of the conductive particles 2a during anisotropic conductive connection can be facilitated.

Figure 8:
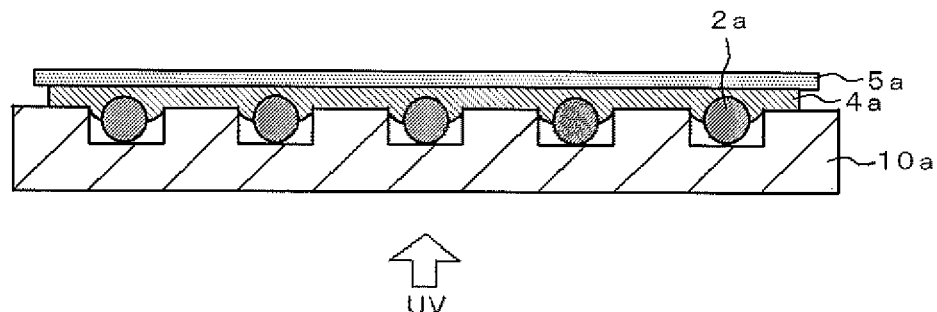
FIG. 8 is a view illustrating a process in a production method of an anisotropic conductive film.

In a second method in which the first insulating resin layer 4a is formed using the photopolymerizable resin, (b1) as shown in FIG. 7C, the first photopolymerizable resin layer 4a is pressed onto the conductive particles in the first transfer mold 10a, (b2) as shown in FIG. 8, the first photopolymerizable resin layer 4a on the first transfer mold 10a is irradiated with ultraviolet light from a side of the first transfer mold 10a, so that the first photopolymerizable resin layer 4a is polymerized to form a photopolymerized resin layer in which the conductive particles are held, and (b3) the photopolymerizable resin layer in which the conductive particles are held is released from the transfer mold. Thus, the photopolymerized resin layer to which the conductive particles are transferred and bonded may be formed. In this case, as the first transfer mold 10a, a transfer mold that is ultraviolet light transmissive is used.

Similarly, the second insulating resin layer 4b to which the conductive particles 2b are transferred and bonded is obtained using the photopolymerizable resin in the step D by the first or second method.

In the first method as well as the second method, when in the step E, the first insulating resin layer 4a and the second insulating resin layer 4b in a semi-cured state are layered, photopolymerized, and integrated, photopolymerization by irradiation with ultraviolet light in the steps B and D may be performed so that the photopolymerizable resin layer is in a semi-cured state. In contrast, when in the step E, the first insulating resin layer and the second insulating resin layer are layered through a separate intermediate resin layer and integrated, the photopolymerizable resin layer may be completely cured in the photopolymerization in the steps B and D.

(iv-4) When Insulating Resin Layer is formed of Thermally Polymerizable and Photopolymerizable Resin Even when the first insulating resin layer 4a and the second insulating resin layer 4b are formed using a thermally polymerizable and photopolymerizable resin to be polymerized by heat or by light, the insulating resin layers to which the conductive particles are transferred and bonded can be obtained depending on a case where the thermally polymerizable resin or the photopolymerizable resin is used.

(v) Step E (v-1) Layering and Integrating of Insulating Resin Layer in Semi-Cured State When in the step B or D, the first insulating resin layer 4a and the second insulating resin layer 4b in a semi-cured state are formed using a photopolymerizable resin, in the step E, a surface of the first insulating resin layer 4a to which the conductive particles 2a are transferred and bonded and a surface of the second insulating resin layer 4b to which the conductive particles 2b are transferred and bonded are faced to each other (FIG. 7F), and layered, and integrated by irradiation with ultraviolet light as they are (FIG. 7G). The release films 5a and 5b are released from the obtained layered body. Thus, the anisotropic conductive film 1A shown in FIG. 1A can be obtained.

When in the step B or D, the first insulating resin layer 4a and the second insulating resin layer 4b in a semi-cured state are formed of the thermally polymerizable resin, the insulating resin layers are layered and integrated by polymerization by heating, similarly.

Figure 9A:
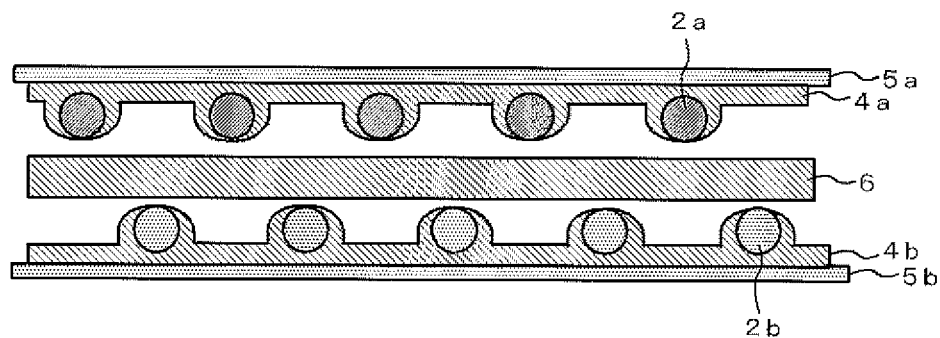
FIG. 9A is a view illustrating a process in the production method of an anisotropic conductive film.
Figure 9B:
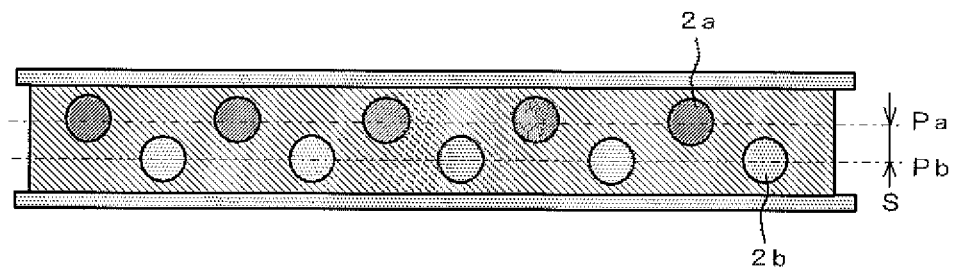
FIG. 9B is a view illustrating a process in the production method of an anisotropic conductive film.

(v-2) Layering and Integrating of Insulating resin layer in Completely-Cured State When in the step B or D, the first insulating resin layer 4a and the second insulating resin layer 4b in a completely-cured state are formed using the photopolymerizable resin, in the step E, an insulating adhesive layer 6 as an intermediate resin layer is disposed between the first insulating resin layer 4a and the second insulating resin layer 4b, as shown in FIG. 9A. The layers are integrated. Thus, the anisotropic conductive film may be obtained. In this case, the insulating adhesive layer 6 can be provided by applying a liquid adhesive resin, adhering a film-shaped adhesive resin, or the like.

The insulating adhesive layer 6 may be formed of the same kind of a resin as that for the first insulating resin layer 4a or the second insulating resin layer 4b. Thus, as shown in FIG. 9E, the first conductive particle layer 4a and the second conductive particle layer 4b are provided in an insulating resin layer of single layer. A distance S between a center line Pa of the conductive particles 2a in the film surface direction of the first conductive particle layer 4a and a center line Pb of the conductive particles 2b in the film surface direction of the second conductive particle layer 4b can be increased. When the distance S is excessively increased, the conductive particles tend to flow due to the flow of the insulating resin during anisotropic conductive connection. Therefore, the distance S is preferably 5 times or less, and more preferably 3 times or less the average particle diameter of the conductive particles 2a and 2b.

Figure 10A:
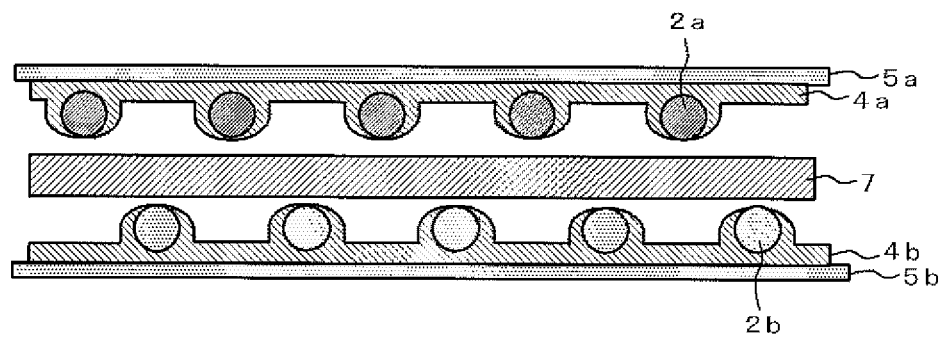
FIG. 10A is a view illustrating a process in the production method of an anisotropic conductive film.
Figure 10B:
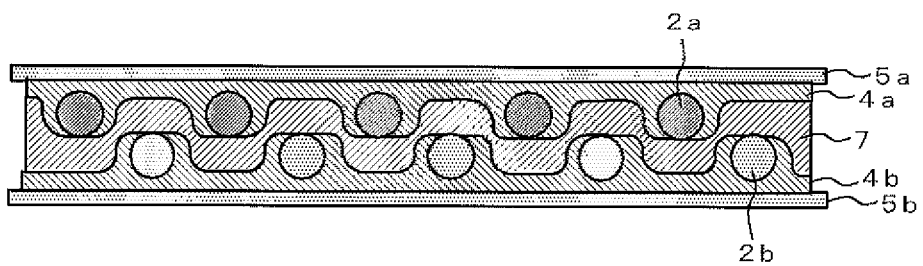
FIG. 10B is a view illustrating a process in the production method of an anisotropic conductive film.

In the step E, as shown in FIG. 10A, a stress relaxation layer 7 formed of a resin containing no polymerization initiator may be provided as an intermediate resin layer, and as shown in FIG. 10B, the layers may be layered and integrated.

Figure 11:
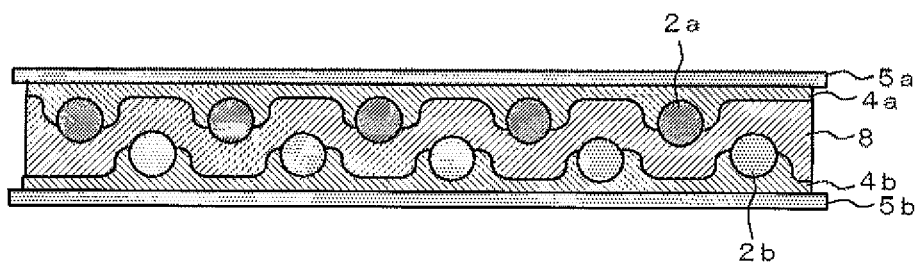
FIG. 11 is a cross-sectional view of an anisotropic conductive film.
Figure 12:
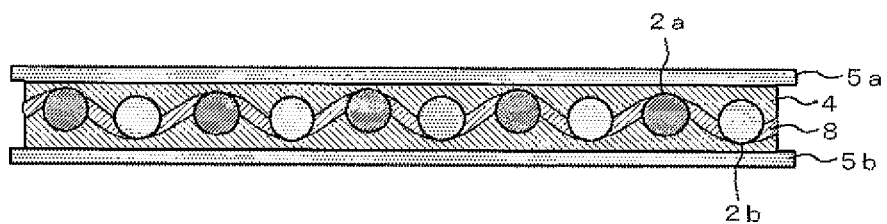
FIG. 12 is a cross-sectional view of an anisotropic conductive film.

When the insulating resin layer 4a has a multilayered structure of the first insulating resin layer 4a holding the first conductive particle layer 3a, the second insulating resin layer 4b holding the second conductive particle layer 3b, and an intermediate resin layer 8 (insulating adhesive layer, stress relaxation layer, etc.) disposed between the layers, as shown in FIG. 11, the conductive particles 2a forming the first conductive particle layer 4a may be protruded from the first insulating resin layer 4a and similarly, the conductive particles 2b forming the second conductive particle layer 3b may be protruded from the second insulating resin layer 4b by appropriately adjusting the depth of recesses of the transfer molds, the thickness of the first insulating resin layer 4a, the thickness of the second insulating resin layer 4b, and the like. Further, when the amount of the first conductive particle layer 3a protruded from the first insulating resin layer 4a and the amount of the second conductive particle layer 3b protruded from the second insulating resin layer 4b are appropriately adjusted, an anisotropic conductive film in which the conductive particles 2a of the first conductive particle layer 4a and the conductive particles 2b of the second conductive particle layer 4b are provided on substantially the same level, as shown in FIG. 12, may be formed.

<<Connection Structure>>

The first anisotropic conductive film of the present invention can be preferably applied to anisotropic conductive connection between a first electronic component such as an IC chip, an IC module, and FPC and a second electronic component such as FPC, a glass substrate, a rigid substrate, and a ceramic substrate. The resultant connection structure is also a part of the present invention.

In a method for connecting electronic components using the anisotropic conductive film, for example, it is preferable that the anisotropic conductive film be temporarily adhered to the second electronic component such as various types of substrates (in a case where an insulating binder layer is formed, temporarily adhered from the insulating binder layer side), the first electronic component such as an IC chip be mounted on the anisotropic conductive film temporarily adhered, and the anisotropic conductive film be thermo-compression bonded from the first electronic component side in terms of enhanced connection reliability. Further, connection can also be achieved by light curing.

EXAMPLES

Hereinafter, the present invention will be described more specifically by Examples.

Examples 1 to 7 and Comparative Examples 1 to 4

A thermally polymerizable insulating resin containing 60 parts by mass of a phenoxy resin (YP-50, NIPPON STEEL & SUMIKIN CHEMICAL CO., LTD.), 40 parts by mass of an epoxy resin (jER828, Mitsubishi Chemical Corporation), and 2 parts by mass of a thermal cationic polymerization initiator (SI-60L, SANSHIN CHEMICAL INDUSTRY CO., LTD.) was prepared. This thermally polymerizable insulating resin was applied to a PET film having a thickness of 50 µm, and dried in an oven of 80° C. for 5 minutes, to form an adhesive insulating resin layer having a thickness of 20 µm on the PET film.

On the other hand, a die having projection portions in an array pattern corresponding to an array pattern shown in Table 1 was formed. Pellets of a publicly known transparent resin were molten and poured into the die, and cooled to harden. Thus, a transfer mold that was made of the resin and had recess portions in the array pattern shown in Table 1 was produced. The recess portions of this transfer mold were charged with conductive particles (AUL 704, SEKTSUI CHEMICAL CO., LTD., particle diameter: 4 µm), and coated with the insulating resin layer described above, and the insulating resin layer was thermally cured. The insulating resin layer was released from the transfer mold to produce a first insulating resin layer to which the conductive particles were transferred and bonded. Similarly, a second insulating resin layer to which the conductive particles were transferred and bonded was produced.

A surface of the first insulating resin layer to which the conductive particles were transferred and bonded and a surface of the second insulating resin layer to which the conductive particles were transferred and bonded were faced to each other, and thermally compression-bonded, to produce an anisotropic conductive film. At that time, in Example 3, an insulating resin film having a thickness of 6 µm (phenoxy resin: 60% by mass, epoxy resin: 40% by mass) was interposed as an intermediate resin layer having a stress relaxation action during anisotropic conductive connection between the first insulating resin layer and the second insulating resin layer. In Example 4, an anisotropic conductive film was produced in the same manner as in Example 1 except that a transfer mold having recess portions that had a lower depth than that in Example 1 (the depth of the transfer mold was 0.4 times the particle diameter) was used.

<Evaluation>

For the anisotropic conductive films of Examples 1 to 7 and Comparative Examples 1 to 4, (a) initial conduction resistance, (b) conduction reliability, and (c) short circuit occurrence ratio were each evaluated as follows. The results are shown in Table 1.

(a) Initial Conduction Resistance

The anisotropic conductive film of each of Examples and Comparative Examples was placed between an IC for evaluation of initial conduction and conduction reliability and a glass substrate, and heated and pressurized (at 180° C. and 80 MPa for 5 seconds) to obtain a connection body for each evaluation. The conduction resistance of this connection body for evaluation was measured. Herein, the IC for evaluation and the glass substrate had terminal patterns corresponding to each other, and the following sizes.

IC for Evaluation of Initial Conduction and Conduction Reliability
  Outside diameter: 0.7×20 mm
  Thickness: 0.2 mm
  Bump specification: gold-plating, height: 12 µm, size: 15×100 µm, gap between bumps: 15 µm Glass Substrate
  Glass material: available from Corning Incorporated
  Outside diameter: 30×50 mm
  Thickness: 0.5 mm
  Electrode: ITO wiring (b) Conduction Reliability The connection body for evaluation having the IC for evaluation of (a) and the anisotropic conductive film of each of Examples and Comparative Examples was left in a constant temperature bath of a temperature of 85° C. and a humidity of 85% RH for 500 hours. After that, the conduction resistance was measured similarly to the measurement of (a). A conduction resistance of 5Ω or more was not preferred in terms of practical conduction stability of a connected electronic component.

(c) Short Circuit Occurrence Ratio

As an IC for evaluation of short circuit occurrence ratio, the following IC (comb-teeth TEG (test element group) having a space of 7.5 µm) was prepared.
  Outside diameter: 1.5×13 mm
  Thickness: 0.5 mm
  Bump specification: gold-plating, height: 15 µm, size: 25×140 µm, gap between bumps: 7.5 µm The anisotropic conductive film of each of Examples and Comparative Examples was placed between the IC for evaluation of short circuit occurrence ratio and a glass substrate of a pattern corresponding to the pattern of the IC for evaluation, and heated and pressurized under the same connection condition as that in (a), to obtain a connection body. The short circuit occurrence ratio of the connection body was determined. The short circuit occurrence ratio was calculated by "occurrence number of short circuit/total number of space of 7.5 µm." The short circuit occurrence ratio is preferably 100 ppm or less in practical terms.

TABLE 1

| | | Comparative Example 1 | Comparative Example 2 | Comparative Example 3 | Comparative Example 4 | Example 1 | Example 2 | Example 3 | Example 4 | Example 5 | Example 6 | Example 7 |
|---|---|---|---|---|---|---|---|---|---|---|---|---|
| First Conductive Particle Layer | Array Pattern | Square Lattice | Square Lattice | Square Lattice | Square Lattice | Square Lattice | Square Lattice | Square Lattice | Square Lattice | Square Lattice | Square Lattice | Square Lattice |
| | Interparticle Distance (Ratio Relative To Particle Diameter) | 0.5 | 1 | 0.5 | 1 | 2 | 4 | 2 | 2 | 2 | 2 | 3 |

TABLE 1-continued

| | | Comparative Example 1 | Comparative Example 2 | Comparative Example 3 | Comparative Example 4 | Example 1 | Example 2 | Example 3 | Example 4 | Example 5 | Example 6 | Example 7 |
|---|---|---|---|---|---|---|---|---|---|---|---|---|
| Second Conductive Particle Layer | Array Pattern | | | Square Lattice | Square Lattice | Square Lattice | Square Lattice | Square Lattice | Square Lattice | Square Lattice | Square Lattice | Square Lattice |
| | Interparticle Distance (Ratio Relative To Particle Diameter) | | | 0.5 | 1 | 2 | 4 | 2 | 2 | 4 | 8 | 8 |
| | Array Of Conductive Particles In Plan View ● First Conductive Particles ○ Second Conductive Particles | | | | | | | | | | | |
| | Distance S Between Center Line Of First Conductive Particle Layer And Center Line Of Second Conductive Particle Layer (μm) | 0 | 0 | 3.2 | 2.2 | 2 | 2 | 8 | 0.8 | 2 | 2 | 2 |
| | Total Particle Number Density Of First Conductive Particle Layer And Second Conductive Particle Layer (particles/mm²) | 28000 | 16000 | — | — | 16000 | 5000 | 16000 | 16000 | 9400 | 7700 | 4500 |
| Evaluation | (a) Initial Conduction Resistance (Ω) | 0.2 | 0.2 | <0.2 | <0.2 | 0.2 | 0.2 | 0.2 | 0.2 | 0.2 | 0.2 | 0.2 |
| | (b) Conduction Reliability (Ω) | 4 | 4 | <4 | <4 | 4 | 4 | 4 | 4 | 4 | 4 | 4 |
| | (c) Short Circuit Occurrence Ratio (ppm) | <50 | <50 | 400> | 250> | <50 | <50 | <50 | <50 | <50 | <50 | <50 |

As seen from Table 1, the anisotropic conductive films of Examples 1 to 7 showed preferable results in practical terms in all evaluation items of initial conduction resistance, conduction reliability, and short circuit occurrence ratio. In Example 3, a distance in a thickness direction between a center line of the first conductive particle layer and a center line of the second conductive particle layer was particularly longer than those in other Examples and Comparative Examples since the intermediate resin layer having a stress relaxation action during anisotropic conductive connection was provided. However, Example 3 showed preferable results in all of initial conduction resistance, conduction reliability, and short circuit occurrence ratio. In Example 4, the distance S in the thickness direction between the center line of the first conductive particle layer and the center line of the second conductive particle layer was 1/5 times the particle diameter of the conductive particles, and was smaller than those in other Examples and Comparative Examples. However, Example 4 provided preferable results in all of initial conduction resistance, conduction reliability, and short circuit occurrence ratio. This shows that there are not problems in practical terms. On the other hand, in Comparative Examples 1 and 2, the anisotropic conductive film was formed of the conductive particle layer of single layer. Comparative Examples 1 and 2 showed preferable results in practical terms in all of initial conduction resistance, conduction reliability, and short circuit occurrence ratio. However, in Comparative Examples 1 and 2, the transfer mold in which the recess portions were densely disposed needed to be used during transferring of the conductive particles from the transfer mold to the insulating resin layer for production. Therefore, it is difficult that the conductive particles are disposed in an expected array without defects. As confirmed from Examples of the present invention, the anisotropic conductive film in which the conductive particles are disposed in the same manner as in Comparative Examples 1 and 2 can be simply produced using the transfer mold in which the recess portions are sparsely disposed.

In Comparative Examples 3 and 4, the distance between the conductive particles in each of the first conductive particle layer and the second conductive particle layer was small, and the conductive particles were too densely disposed. Therefore, the short circuit occurrence ratio was increased.

Even when a photopolymerizable insulating resin containing a phenoxy resin, an acrylate resin, and a photo-radical polymerization initiator was used instead of the thermally polymerizable insulating resin in Examples 1 to 7, Examples 1 to 7 showed preferable results in practical terms in all of initial conduction resistance, conduction reliability, and short circuit occurrence ratio, similarly to the case where the thermally polymerizable insulating resin was used.

Examples 8 to 13 and Comparative Examples 5 to 9

A thermally polymerizable insulating resin containing 60 parts by mass of a phenoxy resin (YP-50, NIPPON STEEL & SUMTKIN CHEMICAL CO., LTD.), 40 parts by mass of an epoxy resin (jER828, Mitsubishi Chemical Corporation), and 2 parts by mass of a thermal cationic polymerization initiator (SI-60L, SANSHIN CHEMICAL INDUSTRY CO., LTD.) was prepared. This thermally polymerizable insulating resin was applied to a PET film having a thickness of 50 μm, and dried in an oven of 80° C. for 5 minutes, to form an adhesive insulating resin layer having a thickness of 20 μm on the PET film.

On the other hand, a die having projection portions in an array pattern corresponding to an array pattern of two-dimensional face-centered lattice was formed. Pellets of a publicly known transparent resin were molten and poured into the die, and cooled to harden. Thus, a transfer mold that was made of the resin and had recess portions in the array pattern of two-dimensional face-centered lattice was produced. The recess portions of this transfer mold were charged with gold-plated conductive particles having an average particle diameter and a particle hardness shown in Table 2 and coated with the insulating resin layer, and the insulating resin layer was thermally cured. The insulating resin layer was released from the transfer mold to produce a first insulating resin layer to which the conductive particles were transferred and bonded. Similarly, a second insulating resin layer to which the conductive particles were transferred and bonded was produced.

A surface of the first insulating resin layer to which the conductive particles were transferred and bonded and a surface of the second insulating resin layer to which the conductive particles were transferred and bonded were faced to each other, and thermally compression-bonded, to produce an anisotropic conductive film.

In Comparative Examples 5 to 8, an insulating bonding layer was produced so that the conductive particles in the first conductive particle layer were formed in a monodisperse (random) or face-centered lattice array and a layer corresponding to the second conductive particle layer did not contain the conductive particles. In Comparative Example 9, the conductive particles in the first and second conductive particle layers were monodispersed.

The gold-plated conductive particles specified by the average particle diameter and the particle hardness in Table 2 were produced as follows, and used.

As the conductive particles specified by the average particle diameter and the particle hardness in Table 2, conductive particles produced using a resin core formed as shown below were used.

<Preparation of Resin Core>

To a solution in which a mixing ratio of divinyl benzene, styrene, and butyl methacrylate was adjusted, benzoyl peroxide as a polymerization initiator was added, and the mixture was heated with uniform stirring at high speed, resulting in a polymerization reaction. Thus, a fine particle dispersion liquid was obtained. The fine particle dispersion liquid was filtered and dried under reduced pressure to obtain a block body as an agglomerate of the fine particles. Further, the block body was pulverized and classified to obtain divinyl benzene-based resin particles having an average particle diameter of 3, 4, or 5 µm as the resin core. The hardness of the particles was adjusted by adjusting the mixing ratio of divinyl benzene, styrene, and butyl methacrylate.

<Formation of Conductive Particles>

Next, a palladium catalyst was carried on the obtained divinyl benzene-based resin particles (5 g) by an immersion method. Subsequently, the resin particles were subjected to electroless nickel plating using an electroless nickel plating liquid (pH: 12, plating liquid temperature: 50° C.) prepared from nickel sulfate hexahydrate, sodium hypophosphite, sodium citrate, triethanol amine, and thallium nitrate. Thus, nickel-coated resin particles having a nickel-plating layer as a surface metal layer were produced.

Subsequently, this nickel-coated resin particles (12 g) was mixed in a solution in which 10 g of sodium tetrachloroaurate was dissolved in 1,000 mL of ion-exchanged water, to prepare an aqueous suspension. To the obtained aqueous suspension, 15 g of ammonium thiosulfate, 80 g of ammonium sulfite, and 40 g of ammonium hydrogenphosphate were added, to prepare a gold plating bath. To the obtained gold plating bath, 4 g of hydroxylamine was added. After that, the pH of the gold plating bath was adjusted to 9 by using ammonia, and the temperature of the bath was maintained at 60° C. for about 15 to 20 minutes to produce conductive particles in which a gold-plating layer was formed on a surface of the nickel-plating layer, as described below.

(A) Average particle diameter: 3 µm, particle hardness: 200 kgf/mm$^2$
(B) Average particle diameter: 3 µm, particle hardness: 400 kgf/mm$^2$
(C) Average particle diameter: 3 µm, particle hardness: 500 kgf/mm$^2$
(D) Average particle diameter: 4 µm, particle hardness: 200 kgf/mm$^2$
(E) Average particle diameter: 5 µm, particle hardness: 50 kgf/mm$^2$
(F) Average particle diameter: 5 µm, particle hardness: 200 kgf/mm$^2$
(G) Average particle diameter: 5 µm, particle hardness: 300 kgf/mm$^2$ <Evaluation>

For the anisotropic conductive films of Examples 8 to 13 and Comparative Examples 5 to 9, (a) initial conduction resistance, (b) conduction reliability, and (c) short circuit occurrence ratio were each evaluated as follows. Additionally, (d) indentation state of bump was observed and evaluated. The results are shown in Table 2.

(a) Initial Conduction Resistance

The anisotropic conductive film of each of Examples and Comparative Examples was placed between an IC for evaluation of initial conduction and conduction reliability and a glass substrate, and heated and pressurized (at 170° C. and 60 MPa for 10 seconds) to obtain a connection body for each evaluation. The conduction resistance of this connection body for evaluation was measured. A conduction resistance of less than 5Ω was evaluated as very good "A," a conduction resistance of 5Ω or more and less than 10Ω was evaluated as good "B," and a conduction resistance of 10Ω or more was evaluated as poor "C." Herein, the IC for evaluation and the glass substrate had terminal patterns corresponding to each other, and the following sizes.

IC for Evaluation of Initial Conduction and Conduction Reliability

Outside diameter: 1.8×20 mm
Thickness: 0.5 mm
Bump specification: gold-plating, height: 14 or 15 µm, size: 30×85 µm (Herein, a bump height of "14 or 15 µm" shows that one bump has a difference in height of 1 µm. A portion of which the height is 14 µm represents a bump recess portion, and a portion of which the height is 15 µm represents a bump projection portion.)

Glass Substrate

Glass material: available from Corning Incorporated
Outside diameter: 30×50 mm
Thickness: 0.5 mm
Electrode: ITO wiring (b) Conduction Reliability The connection body for evaluation having the IC for evaluation of (a) and the anisotropic conductive film of each of Examples and Comparative Examples was left in a constant temperature bath of a temperature of 85° C. and a humidity of 85% RH for 500 hours. After that, the conduction resistance was measured similarly to the measurement of (a). A conduction resistance of less than 10Ω was evaluated as very good "A" in terms of conduction reliability, a conduction resistance of 10Ω or more and less than 20Ω was evaluated as good "B," and a conduction resistance of 20Ω or more was evaluated as poor "C."

(c) Short Circuit Occurrence Ratio

As an IC for evaluation of short circuit occurrence ratio, the following IC (comb-teeth TEG (test element group) having a space of 7.5 μm) was prepared.

Outside diameter: 1.5×13 mm
Thickness: 0.5 mm
Bump specification: gold-plating, height: 15 μm, size: 25×140 μm, bump space: 10 μm, gap between bumps: 7.5 μm, gap number: 16 set (10 points in one set)

Glass Substrate
Outside diameter: 30×50 mm
Thickness: 0.5 mm
Electrode: ITO wiring The anisotropic conductive film of each of Examples and Comparative Examples was placed between the IC for evaluation of short circuit occurrence ratio and the glass substrate of a pattern corresponding to the pattern of the IC for evaluation, and heated and pressurized (at 170° C. and 60 MPa for 10 seconds) to obtain a connection body for each evaluation. The short circuit occurrence ratio of the connection body for evaluation was determined. The short circuit occurrence ratio was calculated by "occurrence number of short circuit/total number of space of 7.5 μm." A short circuit occurrence ratio of less than 50 ppm was evaluated as very good "A," a short circuit occurrence ratio of 50 ppm or more and less than 250 ppm was evaluated as good "B," and a short circuit occurrence ratio of 250 ppm or more was evaluated as poor "C."

(d) Indentation State of Bump

In the connection body for evaluation used in the evaluation of initial conduction resistance, the indentation of 10a bumps was observed from the glass substrate side at a magnification of 20 by an optical microscope. A case where the number of observed indentations was 10 or more was evaluated as very good "A," a case where the number of observed indentations was 8 or 9 was evaluated as good "B," and a case where the number of observed indentations was 7 or less was evaluated as poor "C." When the bump projection portion or the bump recess portion is evaluated as A or B, the anisotropic conductive film can be evaluated as no problem in practical terms.

TABLE 2

| | | Comparative Example | | | | | Example | | | | | |
|---|---|---|---|---|---|---|---|---|---|---|---|---|
| | | 5 | 6 | 7 | 8 | 9 | 8 | 9 | 10 | 11 | 12 | 13 |
| First Conductive Particle Layer | Array Pattern | Random | Face-Centered Lattice | Random | Face-Centered Lattice | Random | Face-Centered Lattice | Face-Centered Lattice | Face-Centered Lattice | Face-Centered Lattice | Face-Centered Lattice | Face-Centered Lattice |
| | Particle Number Density (particles/mm$^2$) | 60000 | 16000 | 60000 | 16000 | 30000 | 8000 | 8000 | 8000 | 8000 | 8000 | 8000 |
| | Interparticle Distance (Ratio Relative To Particle Diameter) | — | 0.6 | — | 1.67 | — | 2 | 2 | 2 | 2 | 2 | 2 |
| | Average Particle Diameter (μm) | 5 | 5 | 3 | 3 | 5 | 5 | 5 | 4 | 5 | 5 | 5 |
| | Particle Hardness (kgf/mm$^2$) | 200 | 50 | 500 | 500 | 200 | 200 | 200 | 200 | 200 | 300 | 300 |
| Second Conductive Particle Layer | Array Pattern | | | | | Random | Face-Centered Lattice | Face-Centered Lattice | Face-Centered Lattice | Face-Centered Lattice | Face-Centered Lattice | Face-Centered Lattice |
| | Particle Number Density (particles/mm$^2$) | | | | | 30000 | 8000 | 8000 | 8000 | 8000 | 8000 | 8000 |
| | Interparticle Distance (Ratio Relative To Particle Diameter) | | | | | — | 4 | 4 | 3 | 2 | 4 | 4 |
| | Average Particle Diameter (μm) | | | | | 3 | 3 | 3 | 3 | 5 | 3 | 3 |
| | Particle Hardness (kgf/mm$^2$) | | | | | 500 | 500 | 200 | 500 | 300 | 200 | 400 |
| | Array Of Conductive Particles In Plan View<br>● First Conductive Particles<br>○ Second Conductive Particles | | ●●●<br>○●○<br>●●● | | ●●●<br>○●○<br>●●● | | ●●●<br>○●○<br>●●● | ●●●<br>○●○<br>●●● | ●●●<br>○●○<br>●●● | ●●●<br>○●○<br>●●● | ●●●<br>○●○<br>●●● | ●●●<br>○●○<br>●●● |
| Evaluation | (a) Initial Conduction Resistance (Ω) | A | A | B | B | A | A | A | A | B | B | B |
| | (b) Conduction Reliability (Ω) | A | A | C | C | A | A | A | A | B | B | B |
| | (c) Short Circuit Occurrence Ratio (ppm) | C | A | A | A | C | A | A | A | A | A | A |
| | (d) Indentation State | | | | | | | | | | | |
| | Bump Projection Portion | B | C | A | A | A | A | B | A | B | B | B |
| | Bump Recess Portion | B | C | C | C | B | B | B | B | C | C | C |

In Examples 8 to 13 and Comparative Examples 5 to 9, the particle diameter and particle hardness of the conductive particles and a relationship between the evaluated results were investigated.

As seen from Table 2, the anisotropic conductive films of Examples 8 to 13 had an interparticle distance that was 2 times or more the average particle diameter and good balance between the particle diameter and the particle hardness of the conductive particles. Therefore, the anisotropic conductive films showed preferable results in practical terms in all evaluation items of initial conduction resistance, conduction reliability, short circuit occurrence ratio, and indentation state of the bump. In Examples 11 to 13, the indentation state of the bump recess portion was evaluated as C, but the indentation state of the bump projection portion was evaluated as B. Therefore, the anisotropic conductive films had no problems in practical terms.

In contrast, in the anisotropic conductive films of Comparative Examples 5 to 8, the layer corresponding to the second conductive particle layer was an insulating resin layer containing no conductive particles, different from Examples.

In the anisotropic conductive film of Comparative Example 5, the average particle diameter of the conductive particles was as relatively large as 5 μm, the particle number density was as relatively high as 60,000 particles/mm$^2$, and the conductive particles were randomly dispersed. Therefore, the short circle occurrence ratio was evaluated as C. In contrast, in the anisotropic conductive film of Comparative Example 7, the particle number density was as relatively high as 60,000 particles/mm$^2$, and the conductive particles were randomly dispersed, but had an average particle diameter as relatively small as 3 μm. Therefore, the recesses and projections of the bump were not canceled, and the conduction reliability was evaluated as C.

In the anisotropic conductive film of Comparative Example 6, the conductive particles were arranged in a face-centered lattice, the average particle diameter were as relatively large as 5 μm, and the particle hardness was as relatively too soft as 50 kgf/mm$^2$. Therefore, the indentation states of the bump recess portion and the bump projection portion were evaluated as C. Accordingly, the anisotropic conductive film did not sufficiently correspond to the bump having recesses and projections. In contrast, in the anisotropic conductive film of Comparative Example 8, the average particle diameter of the conductive particles was as relatively small as 3 μm, and the particle hardness was as relatively high as 500 kgf/mm$^2$. Therefore, the indentation state of the bump projection portion was evaluated as A, and the conduction reliability was evaluated as C. This is considered because connection particularly at the recess portion of the bump was not maintained due to too small particle diameter, to increase the resistance value.

In the anisotropic conductive film of Comparative Example 9, the first conductive particle layer and the second conductive particle layer were layered, but randomly disposed, and the particle number density of the conductive particles in each layer was 30,000 particles/mm$^2$. Therefore, the short circle occurrence ratio was evaluated as C. This is considered because contact between the conductive particles is likely to occur.

Even when a photopolymerizable insulating resin containing a phenoxy resin, an acrylate resin, and a photoradical polymerization initiator was used instead of the thermally polymerizable insulating resin in Examples 8 to 13, Examples 8 to 13 showed results without problems in practical terms in all of initial conduction resistance, conduction reliability, short circuit occurrence ratio, and indentation state of the bump, similarly to a case where the thermally polymerizable insulating resin was used.

INDUSTRIAL APPLICABILITY

The anisotropic conductive film of the present invention is useful in anisotropic conductive connection of an electronic component such as an IC chip to a wiring substrate. The width of the wiring of the electronic component has been decreased. The present invention is particularly useful in anisotropic conductive connection of an electronic component having a decreased wiring width.

REFERENCE SIGNS LIST 1A, 1B, 1C, 1D, 1X anisotropic conductive film
2a, 2b conductive particles
3a first conductive particle layer
3b second conductive particle layer
4 insulating resin layer
4a first insulating resin layer
4b second insulating resin layer
5a release film
6 insulating adhesive layer
7 stress relaxation layer
8 intermediate resin layer
10a transfer mold
11 recess portion
20 electronic component
21 terminal
22 electronic component
23 terminal
Da average particle diameter of conductive particles in first conductive particle layer
Db average particle diameter of conductive particles in second conductive particle layer
La closest distance between conductive particles in first conductive particle layer
Lb closest distance between conductive particles in second conductive particle layer
Lc closest distance between conductive particles in anisotropic conductive film in plan view
Pa center line of conductive particles in first conductive particle layer
Pb center line of conductive particles in second conductive particle layer
S distance between center line of conductive particles in first conductive particle layer and center line of conductive particles in second conductive particle layer
z film thickness direction

The invention claimed is:

1. An anisotropic conductive film in which conductive particles are dispersed in an insulating resin layer, the anisotropic conductive film comprising:
   a first conductive particle layer in which conductive particles are dispersed at a predetermined depth in a film thickness of the anisotropic conductive film; and
   a second conductive particle layer in which conductive particles are dispersed at a depth that is different from that of the first conductive particle layer, wherein
   in each of the conductive particle layers, a closest distance between the adjacent conductive particles is 2 times or more an average particle diameter of the conductive particles.

2. The anisotropic conductive film according to claim 1, wherein a closest interparticle distance of the conductive particles in each of the conductive particle layers is 2 times or more and 50 times or less the average particle diameter of the conductive particles.

3. The anisotropic conductive film according to claim 1, wherein the conductive particles in the first conductive particle layer and the conductive particles in the second conductive particle layer are different from each other in order to cancel a variation of a distance between counter electrodes to be connected by anisotropic conductive connection.

4. The anisotropic conductive film according to claim 1, wherein the conductive particles in the first conductive particle layer and the conductive particles in the second conductive particle layer have different average particle diameters and/or different particle hardnesses.

5. The anisotropic conductive film according to claim 1, wherein the conductive particles in the first conductive particle layer and the conductive particles in the second conductive particle layer are shifted in position when the anisotropic conductive film is observed in a plan view.

6. The anisotropic conductive film according to claim 1, wherein a distance between a center of the first conductive particle layer and a center of the second conductive particle layer in a direction of a film thickness of the anisotropic conductive particle is 1/5 or more the average particle diameter of the conductive particles.

7. The anisotropic conductive film according to claim 1, wherein the conductive particles in each of the conductive particle layers are arrayed in a lattice pattern.

8. The anisotropic conductive film according to claim 1, wherein arrays of the conductive particles in the first conductive particle layer and the second conductive particle layer are the same.

9. The anisotropic conductive film according to claim 1, wherein the insulating resin layer is formed of a photopolymerized resin.

10. The anisotropic conductive film according to claim 1, wherein:
the insulating resin layer has a layered structure of a first insulating resin layer formed of a polymerizable resin, an intermediate layer containing no polymerization initiator, and a second insulating resin layer formed of a polymerizable resin;
at least part of each of the conductive particles in the first conductive particle layer is embedded in the first insulating resin layer;
at least part of each of the conductive particles in the second conductive particle layer is embedded in the second insulating resin layer; and
the intermediate resin layer is present in between the conductive particle in the first conductive particle layer and the conductive particle in the second conductive particle layer.

11. A connection structure in which a first electronic component is subjected to anisotropic conductive connection to a second electronic component through the anisotropic conductive film according to claim 1.

12. A process for the manufacture of a connection structure comprising subjecting a first electronic component to anisotropic conductive connection to a second electronic component through the anisotropic conductive film according to claim 1.

13. The anisotropic conductive film according to claim 6, wherein the distance is 1/2 to 5 times the average particle diameter of the conductive particles.

* * * * *